United States Patent [19]

Suwa

[11] Patent Number: 5,668,762
[45] Date of Patent: Sep. 16, 1997

[54] SEMICONDUCTOR MEMORY DEVICE ALLOWING REDUCTION OF POWER CONSUMED IN A SHARED SENSE AMPLIFIER TYPE SENSE AMPLIFIER

[75] Inventor: Makoto Suwa, Hyogo, Japan

[73] Assignee: Mitsubishi Denki Kabushiki Kaisha, Tokyo, Japan

[21] Appl. No.: 510,627

[22] Filed: Aug. 3, 1995

[30] Foreign Application Priority Data

Dec. 2, 1994 [JP] Japan .................. 6-299930

[51] Int. Cl.⁶ .................. G11C 11/34
[52] U.S. Cl. .................. 365/189.11; 365/205; 365/194; 365/202
[58] Field of Search .................. 365/189.11, 230.03, 365/230.06, 233, 189.01, 205, 194, 202

[56] References Cited

U.S. PATENT DOCUMENTS

| 4,649,523 | 3/1987 | Holder, Jr. et al. | 365/203 |
| 4,825,418 | 4/1989 | Itoh et al. | 365/207 |
| 5,267,214 | 11/1993 | Fujishima et al. | 365/230.03 |
| 5,412,604 | 5/1995 | Fukuda et al. | 365/189.11 |

FOREIGN PATENT DOCUMENTS

| 1-162296 | 6/1989 | Japan . |
| 4-360094 | 12/1992 | Japan . |

OTHER PUBLICATIONS

German Patent Office Search Report, Jan. 27, 1997 and translation thereof.

*Primary Examiner*—Viet Q. Nguyen
*Attorney, Agent, or Firm*—Lowe, Price, LeBlanc & Becker

[57] ABSTRACT

A semiconductor memory device 251 has a sense amplifier 7 of shared sense amplifier type. A switching signal generating circuit 253 is provided for application of control signals $\phi_1$ and $\phi_2$ to a control electrode of a connection transistor of sense amplifier 7. Switching signal generating circuit 253 applies control signals $\phi_1$ and $\phi_2$ which is boosted only for a prescribed time period after the rise of external /RAS signal to the control electrode of the connection transistor of sense amplifier 7. Therefore, as compared with the operation in which control signals $\phi_1$ and $\phi_2$ which are constantly boosted are applied, power consumption can be reduced.

11 Claims, 15 Drawing Sheets

SEMICONDUCTOR MEMORY DEVICE ALLOWING REDUCTION OF POWER CONSUMED IN A SHARED SENSE AMPLIFIER TYPE SENSE AMPLIFIER

BACKGROUND OF THE INVENTION

1. Field of the Invention

The present invention relates to a semiconductor memory device, and, more specifically, to a semiconductor memory device allowing reduction in power consumption.

2. Description of the Background Art

FIG. 10 is a schematic block diagram of a dynamic RAM (hereinafter referred to as DRAM) as an example of a conventional semiconductor memory device.

Referring to FIG. 10, a DRAM 1 includes a memory cell array portion 1, row decoders 9a and 9b, a column decoder 11, a read/write circuit 13, an address buffer 15, an address counter 17, a switch signal generating circuit 19, a /RAS input circuit 21, a /CAS input circuit 23, a data output circuit 25, a data input circuit 27, and a /WE input circuit 29. Further, DRAM 1 includes an address input terminal group 31, an external /RAS signal input terminal 33, an external /CAS signal input terminal 35, a data output terminal 37, a data input terminal 39 and a /WE signal input terminal 41.

Memory cell array portion 3 includes memory cell arrays 5a, 5b and a sense amplifier 7. Between memory cell arrays 5a and 5b, sense amplifier 7 is provided. Each of memory cell arrays 5a and 5b includes a plurality of memory cells each consisting of one transistor and one capacitor, with the memory cells arranged in a matrix. Word lines are connected to respective memory cells in the row direction, and bit lines are connected to respective memory cells in the column direction.

To /RAS input circuit 21, an external /RAS signal is input through external /RAS signal input terminal 33, and an output therefrom is applied to an address counter 17, address buffer 15 and switch signal generating circuit 19. To /CAS input circuit 23, an external /CAS signal is input through external /CAS signal input terminal 35, and an output therefrom is applied to address counter 17 and address buffer 15.

An output from address counter 17 is applied to address buffer 15. To address buffer 15, address signals A0 to An from address input terminal group 31 are also applied. Address buffer 15 applies a row address RA to each of row decoders 9a and 9b, and to switch signal generating circuit 19. Further, address buffer 15 applies a column address CA to column decoder 11.

Row decoder 9a selects a word line WL of memory cell array 5a in accordance with row address RA1, and row decoder 9b selects a word line WL of memory cell array 5b in accordance with row address RA2. Column decoder 11 selects (a pair of) bit lines BL of memory cell arrays 5a and 5b, respectively, in accordance with column address CA. The selected bit lines BL are connected to an I/O line. The I/O line is connected to read/write circuit 13. To read/write circuit 13, an output from data input circuit 27 is applied, and an output from read/write circuit 13 is applied to data output circuit 25. An output from /WE input circuit 29 are applied to data output circuit 25 and data input circuit 27.

A write enable /WE signal from /WE signal input terminal 41 is applied to /WE input circuit 29. Therefore, /WE input circuit 29 applies a write enable /WE signal for writing, especially, to data input circuit 27, and data input circuit 27 applies data input through data input terminal 39 to read/write circuit 13. By contrast, /WE input circuit 29 operates to apply the read data, which has been applied from read/write circuit 13 to data output circuit 25, to data output terminal 37.

FIG. 11 is a schematic diagram of the sense amplifier shown in FIG. 10, and FIG. 12 is a schematic diagram of the switch signal generating circuit of FIG. 10.

Referring to FIG. 11, sense amplifier (SA) 7 includes N channel MOS transistors (hereinafter referred to as NMOS) Q5, Q6, Q7 and P channel MOS transistors (hereinafter referred to as PMOS) Q8, Q9 and Q10. Sense amplifier 7 is connected to bit line pair BL1, /BL1 of memory cell array 5a through connection transistors Q1 and Q2, and connected to bit line pair BL2, /BL2 of memory cell array 5b through transistors Q3, Q4. Connection transistors Q1, Q2, Q3 and Q4 are NMOSs. Such a structure in which two sets of bit line pairs are connected to a set of sense amplifiers through connection transistors is referred to as a shared sense amplifier configuration. The shared sense amplifier type sense amplifiers have come to be used in recent DRAMs having large capacities.

A memory cell MC1 including one transistor and one capacitor is connected to bit line BL1 and word line WL1, and a memory cell MC2 is connected to bit line BL2 and word line WL2. Sense amplifier 7 writes, stores and reads data to and from such memory cells MC1 and MC2. For enabling reading or the like, it is necessary that bit line pair BL1, /BL1 or bit line pair BL2, /BL2 is connected to sense amplifier 7.

Accordingly, a control signal $\phi_1$ is connected to control electrode of each of connection transistors Q1 and Q2, and control signal $\phi_2$ is applied to a control electrode of each of connection transistors Q3 and Q4.

In order to write data without fail to each of the memory cells MC1 and MC2, sense amplifier 7 must transmit a signal which has been amplified to the level of a power supply potential through connection transistors Q1, Q2, Q3 and Q4 to memory cells MC1 and MC2, without lowering the potential. Since connection transistors Q1, Q2, Q3 and Q4 are formed of NMOSs, it is necessary that control signals $\phi_1$ and $\phi_2$ input to connection transistors are boosted to be higher than the level of the power supply potential.

Therefore, switch signal generating circuit 19 includes a charge pump circuit 103 and a charge pump circuit 107, as shown in FIG. 12. Further, switch signal generating circuit 19 includes inverters 101a, 101b, 101c, an oscillating circuit 105, PMOSs 109a, 109b, NMOSs 111a, 111b, and an NAND gate 113.

Charge pump circuit 103 operates in response to an external /RAS input from /RAS input circuit 21. Charge pump circuit 107 continuously operates in response to a signal $\phi_C$ output from oscillating circuit 105. Charge pump circuits 103 and 107 generate a boosting signal $\phi_H$. The boosting signal $\phi_H$ is output as a control signal $\phi_1$ or $\phi_2$ through PMOS 109b.

More specifically, dependent on the signal level of external /RAS and row address RA, NAND gate 113 outputs a signal at a logic high level. Therefore, NMOS 111a turns on and NMOS 111b turns off. Through NMOS 111a, a signal of a logic low level, which is ground potential, is applied to the control electrode of PMOS 109b, and PMOS 109b turns on. Therefore, boosting signal $\phi_H$ is applied to the control electrode of PMOS 109a through PMOS 109b, so that PMOS 109a turns off. Further, boosting signal $\phi_H$ is output as control signal $\phi_1$ or $\phi_2$ through PMOS 109b.

In this manner, control signal $\phi_1$ ($\phi_2$) is generated in accordance with the address signal RA applied to NAND gate 113.

FIG. 13 is a time chart showing signals required in the sense amplifier of FIG. 11 and the switch signal generating circuit of FIG. 12, in which (a) shows the waveform of external /RAS, (b) shows the waveform of signal $\phi_C$ output from the oscillating circuit, (c) is a waveform of boosting signal $\phi_H$, (d) shows waveforms of row addresses RA1 and RA2, (e) shows waveforms of control signals $\phi_1$ and $\phi_2$ applied to the connection transistor, (f) shows states of word lines WL1 and WL2, (g) shows states of bit line pairs BL1 and /BL1, and (h) shows states of bit line pairs BL2, /BL2.

The operation of the circuit shown in FIGS. 11 and 12 will be described with reference to FIG. 13.

First, even when external /RAS is at the high (H) level (standby state), oscillating circuit 105 operates. Therefore, charge pump circuit 107 is generating a boosting signal $\phi_H$ of the boosted level.

When external /RAS changes to the L level, row address RA1 (RA2) is taken. For example, in FIG. 13, row address RA1 is at the H level, and thus word line WL1 is selected. Therefore, bit line pair BL2, /BL2 sharing sense amplifier 7 with bit line pair BL1, /BL1 must be separated from sense amplifier 7. Accordingly, control signal $\phi_2$ is at the L level.

Thereafter, word line WL1 is selected and attains to the H level. Therefore, data in memory cell MC1 is read to bit line BL1, and sense amplifier 7 amplifies potential difference between bit lines BL1 and /BL1.

In this manner, access is allowed when external /RAS attains to the L level. Thereafter, external /RAS signal attains to the H level and word line WL1 attains to the L level. At this time, data amplified by sense amplifier 7 is again written to memory cell MC1. This operation is referred to as restore operation.

Then, control signal $\phi_2$ changes from the L level to the H level, and connection transistors are all set to the standby state.

Recently, memories of large storage capacity have come to be widely used in portable equipments. Power consumption in accessing the memories has been decreased, and especially a DRAM having self refresh function for reducing power consumption while data is retained has been developed. Here, the self refresh function refers to a function in which data of all the memory cells are successively refreshed automatically in the chip of the DRAM when an input sequence satisfying a prescribed condition is externally applied, allowing data retention.

FIG. 14 is a schematic block diagram of a DRAM having such a self refresh function, and FIG. 15 is a block diagram showing the self refresh signal generating circuit and the internal /RAS generating circuit shown in FIG. 14.

Referring to FIG. 14, portions different from the DRAM 1 of FIG. 10 will be mainly described. The DRAM 151 shown in FIG. 14 further includes a self refresh signal generating circuit 153 and an internal /RAS generating circuit 155. To self refresh signal generating circuit 153, an external /RAS is input through external /RAS signal input terminal 33, and an external /CAS signal is input through external /CAS signal input terminal 35. Based on these two signals, self refresh signal generating circuit 153 applies a self refresh signal $\phi_{SELF}$ to /RAS input circuit 21 and internal /RAS generating circuit 155. Based on the applied self refresh signal $\phi_{SELF}$, internal /RAS generating circuit 155 generates internal (int) /RAS and applies this signal to /RAS input circuit 21.

Self refresh signal generating circuit 153 and internal /RAS generating circuit 155 are structured as shown in FIG. 15. More specifically, self refresh signal generating circuit 153 and internal /RAS generating circuit 155 includes a CBR (/CAS before /RAS) detecting circuit 201, a timer circuit 203, an oscillating circuit 205 and a frequency dividing circuit 207. External /RAS and external /CAS are input to CBR detecting circuit 201, and an output from this circuit is applied to timer circuit 203. To timer circuit 203, the signal $\phi_C$ which is an output from oscillating circuit 205 is also applied, and self refresh signal $\phi_{SELF}$ is output from timer circuit 203. Self refresh signal $\phi_{SELF}$ is applied to frequency dividing circuit 207, and frequency dividing circuit 207 outputs internal /RAS based on the signal $\phi_C$ which is the output from oscillating circuit 205, and on the self refresh signal $\phi_{SELF}$.

FIG. 16 is a diagram of waveforms showing the operation of the self refresh signal generating circuit and the internal /RAS generating circuit shown in FIG. 15, in which (a) shows external /RAS, (b) shows external /CAS, (c) shows the signal $\phi_C$, (d) shows the self refresh signal $\phi_{SELF}$, (e) shows internal /RAS and (f) shows control signals $\phi_1$ and $\phi_2$.

Referring to FIG. 16, at the time of self refresh, external /CAS changes from the H level to the L level before external /RAS changes from the H level to the L level. This is detected by CBR detecting circuit 201. Based on the result of detection, timer circuit 203 operates.

Thereafter, when the period in which external /RAS is at the L level and external /CAS is at the L level exceeds a prescribed time period, timer circuit 203 generates a self refresh signal $\phi_{SELF}$.

Then, as the self refresh signal $\phi_{SELF}$ is generated, frequency dividing circuit 207 generates internal /RAS signal in every prescribed period obtained by frequency-dividing the oscillation signal $\phi_C$. Refreshing is performed intentionally, by internal address counter 17.

In such a DRAM 151 that has the self refresh function, switch signal generating circuit 19 generates control signal $\phi_1$ or $\phi_2$ as internal /RAS attains to the L level, and thereafter restore operation takes place.

However, since control signal $\phi_1$ ($\phi_2$) is generated once in every 1 cycle in which external /RAS or internal /RAS changes its level, the switch signal generating circuit consumes the voltage of the boosting signal $\phi_H$ in order to charge the control electrode of connection transistors. In order to compensate for this consumed voltage, charge pump circuit 103 operates in response to external /RAS signal or internal /RAS signal, to charge the boosting signal $\phi_H$. This prevents lowering of the potential level.

However, if the cycle time of external /RAS signal or internal /RAS is long, the level of the boosting signal $\phi_H$ lowers because of leak current. Because of this lowering of the level, it is possible that the signal amplified by the sense amplifier is not adequately written to the memory cell in restore operation. This may lead to shortened data storage time. In order to cope with this problem, the charge pump circuit which operates continuously is provided, so that the boosting signal $\phi_H$ is boosted periodically to prevent level lowering.

However, since the charge pump circuit which continuously operates is provided, there is considerable power consumption.

SUMMARY OF THE INVENTION

Therefore, an object of the present invention is to provide a semiconductor memory device in which power consumption in switch signal generating circuit can be suppressed.

A semiconductor memory device in accordance with a certain aspect of the present invention includes a first bit line pair (BL1, /BL1), a second bit line pair (BL2, /BL2), a sense amplifier (7), a control signal generating portion (253, 353, 451), a first connection transistor (Q1, Q2) and a second connection transistor (Q3, Q4). One of the bit lines (BL1) of the first bit line pair (BL1, /BL1), a memory cell (MC1) is connected. To one of the bit lines (BL2) of the second bit line pair (BL2, /BL2), a memory cell (MC2) is connected. Sense amplifier (7) amplifies potential of the first bit line pair (BL1, BL1) or the second bit line pair (BL2, /BL2). The control signal generating portion (253, 353, 451) generates a first control signal ($\phi_1$) or a second control signal ($\phi_2$) of a boosted potential level which is, only for a prescribed time period, higher than the level of the power supply potential. The first connection transistor (Q1, Q2) connects the first bit line pair (BL1, /BL1) to sense amplifier (7) in response to application of the first control signal ($\phi_1$) generated by control signal generating portion (253, 353, 451) to its control electrode. The second connection transistor (Q3, Q4) connects the second bit line pair (BL2, /BL2) to sense amplifier (7) in response to application of the second control signal ($\phi_2$) generated by the control signal generating portion (253, 353, 451) to its control electrode.

Therefore, according to this aspect, the first or the second control signal at a boosted potential level which is higher than the level of the power supply potential is generated only for a prescribed time period, and it is applied to the control electrode of the first or second connection transistor. Therefore, as compared with the operation in which the first or the second control signal at the boosted potential level is continuously generated, power consumption can be reduced.

The semiconductor memory device according to another aspect of the present invention includes a first bit line pair (BL1, /BL1), a second bit line (BL2, /BL2), a sense amplifier (7), a control signal generating portion (451), a first connection transistor (Q1, Q2), a second connection transistor (Q3, Q4), an input portion (21), a self refresh signal generating portion (153), and an internal control signal generating portion (155). A memory cell (MC1) is connected to one of the bit lines (BL1) of the first bit line pair (BL1, /BL1). A memory cell (MC2) is connected to one of the bit lines (BL2) of the second bit line pair (BL2, /BL2). Sense amplifier (7) amplifies the potential of the first bit line pair (BL1, /BL1) or the second bit line pair (BL2, /BL2). The control signal generating portion (451) generates a first control signal ($\phi_1$) or a second control signal ($\phi_2$). The first connection transistor (Q1, Q2) connects the first bit line pair (BL1, /BL1) and the sense amplifier (7) in response to application of the first control signal ($\phi_1$) generated by the control signal generating portion (451) to its control electrode. The second connection transistor (Q3, Q4) connects the second bit line pair (BL2, /BL2) and sense amplifier (7) in response to application of the second control signal ($\phi_2$) generated by the control signal generating portion (451) to its control electrode. The input portion (21) receives external control signal (external /RAS), and inputs this signal to the inside of the device. Self refresh signal generating portion (153) generates a self refresh signal ($\phi_{SELF}$) for self refreshing data of a memory cell (MC1) connected to one of the bit lines (BL1) of the first bit line pair (BL1, /BL1) or a memory cell (MC2) connected to one of the bit lines (BL2) of the second bit line pair (BL2, /BL2) based on the external control signal (external /RAS) input through the input portion (21). Internal control signal generating portion (155) generates an internal control signal (internal /RAS) based on the self refresh signal ($\phi_{SELF}$) generated by the self refresh signal generating portion (153). Control signal generating portion (451) includes a switching portion (459a, 459b, 459c, 461, 455) for generating, in normal operation, a first control signal ($\phi_1$) applied to the first connection transistor (Q1, Q2) or a second control signal ($\phi_2$) applied to the second connection transistor (Q3, Q4) having boosted potential level which is higher than the level of the power supply potential, and switched for generating, in self refresh operation, the first control signal ($\phi_1$) applied to the first connection transistor (Q1, Q2) or a second control signal ($\phi_2$) applied to the second connection transistor (Q3, Q4) having boosted potential level only for a prescribed period higher than the power supply potential level, in response to a trailing edge of level change of the internal control signal (internal /RAS) generated by the internal control signal generating portion (155).

Therefore, according to this aspect, in normal operation, the first or second control signal which is constantly at the boosted potential level higher than the level of the power supply potential is applied to the first or second connection transistor, allowing access without time delay. Further, in self refresh operation, the first or second control signal which is at the boosted potential level higher than the power supply potential level only for a prescribed time period is applied to the first or second control transistor, and therefore power consumption can be reduced.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 5 is a schematic block diagram of a DRAM as a semiconductor memory device in accordance with another embodiment of the present invention.

DESCRIPTION OF THE PREFERRED EMBODIMENTS

In the following, portions different from the examples of the background art shown in FIGS. 10 and 12 will be described with reference to FIGS. 1 and 2.

Figure 1:
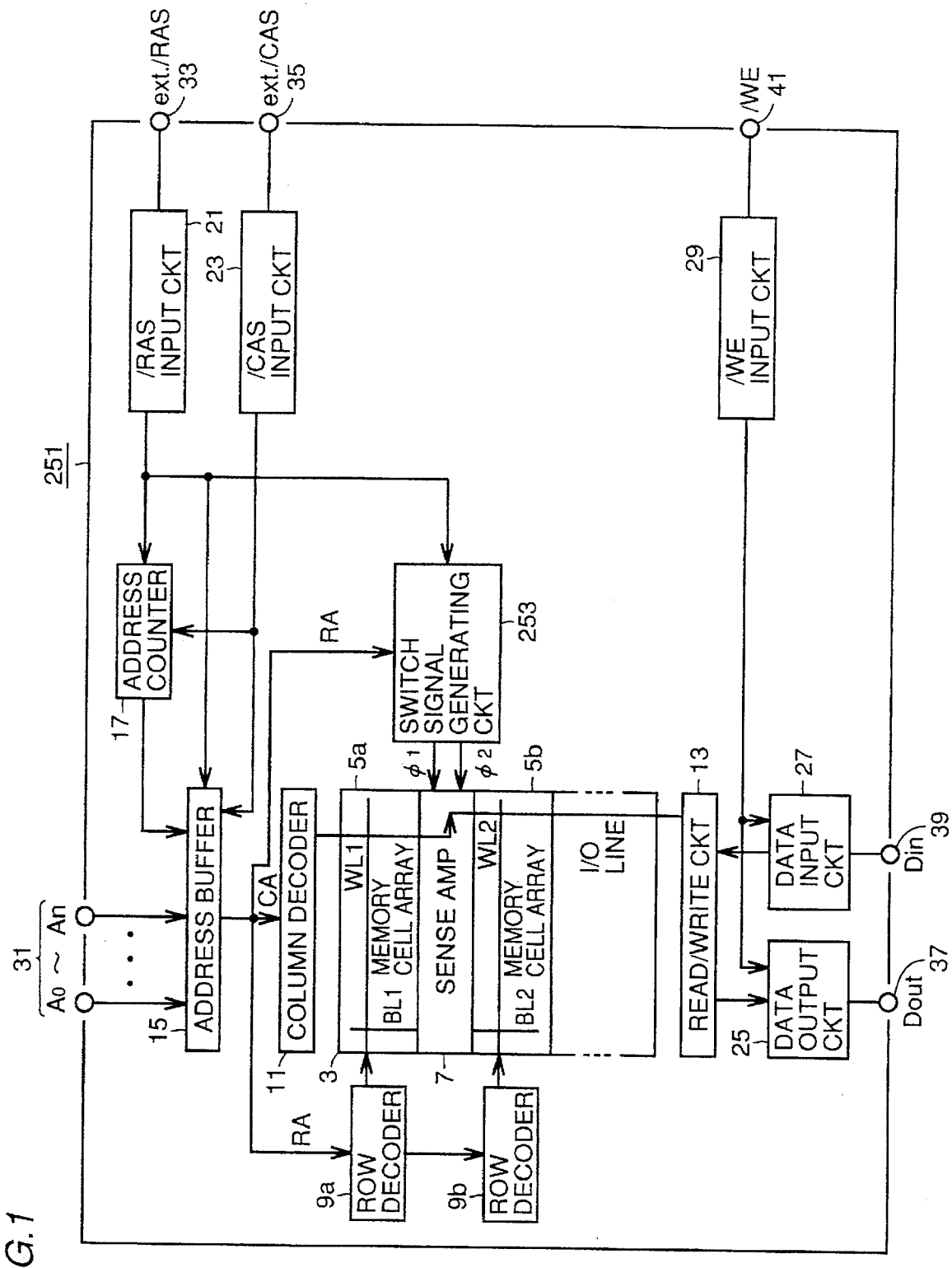
FIG. 1 is a schematic block diagram of a DRAM as a semiconductor memory device, in accordance with one embodiment of the present invention.
Figure 10:
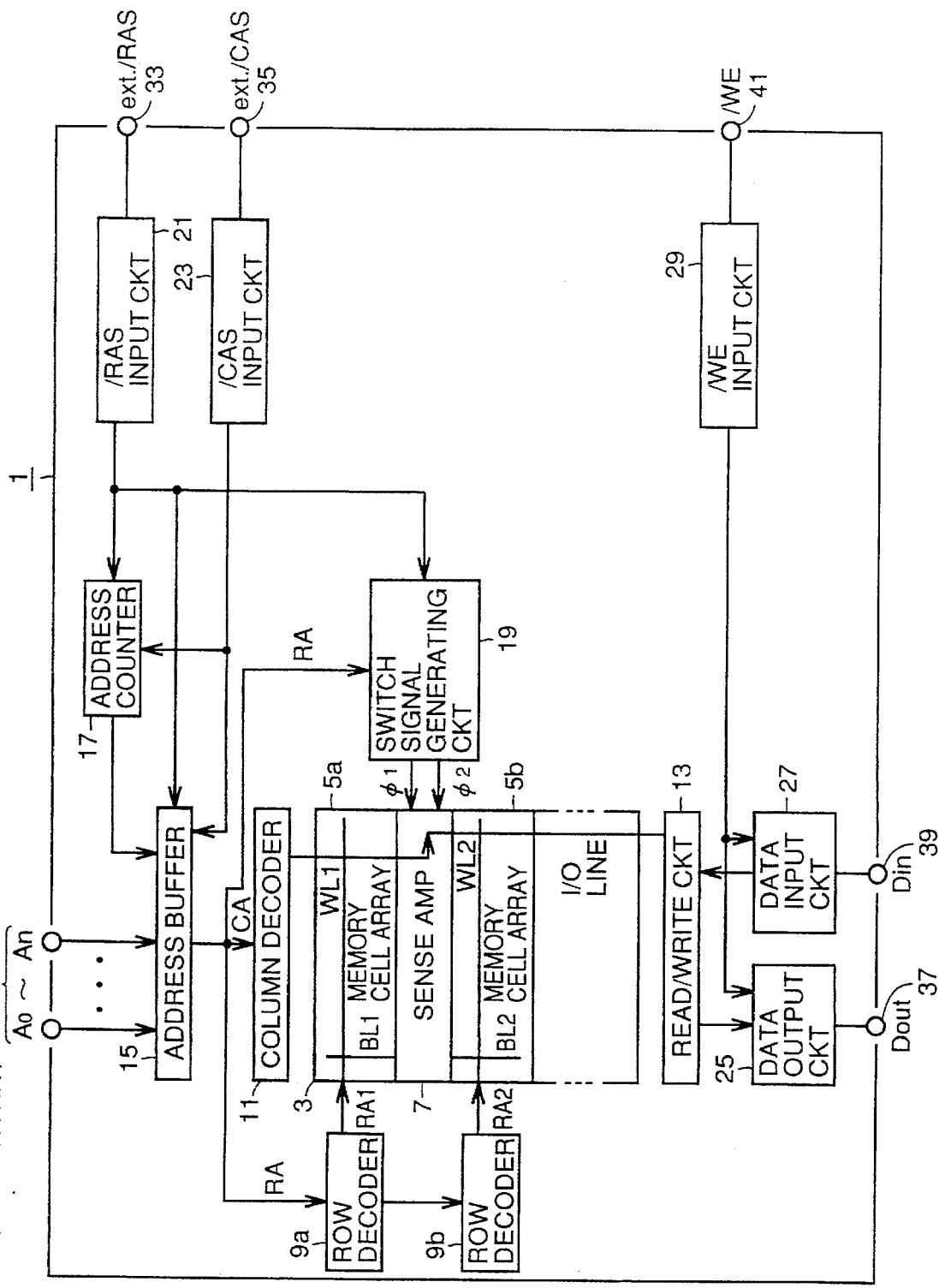
FIG. 10 is a schematic block diagram of a DRAM as a conventional semiconductor memory device.
Figure 11:
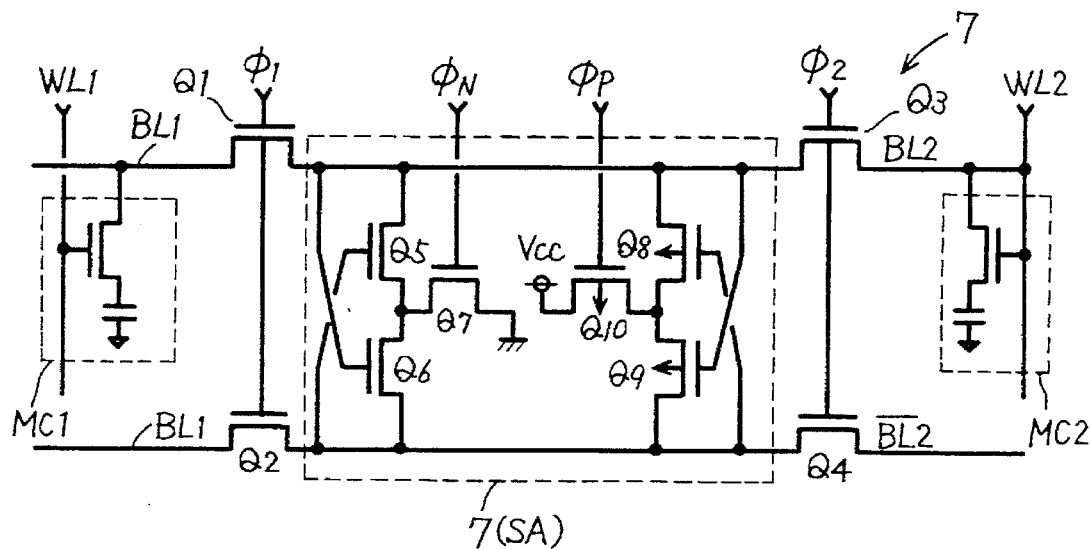
FIG. 11 is a schematic diagram of the sense amplifier shown in FIG. 10.

A DRAM 251 shown in FIG. 1 includes, in place of switch signal generating circuit 19 of the conventional DRAM 1 shown in FIG. 10, a switch signal generating circuit 253. Switch signal generating circuit 253 has such a structure as shown in FIG. 2. More specifically, switch signal generating circuit 253 includes a voltage boosting circuit 301, a delay circuit 303, a 3 NAND gate 305, NAND gates 307a, 307b, inverters 309a, 309b, a PMOS 311 and an NMOS 313.

Boosting circuit 301 includes a PMOS 315, inverters 317a and 317b, and a capacitor 319. Delay circuit 303 includes inverters 321a to 321d.

Connection will be described. External /RAS is input to 3 NAND gate 305, inverter 321a of delay circuit 303 and to NAND gate 307a. An output from inverter 321a is provided as a signal N1 to 3 NAND gate 305, through inverters 321b and 321c. An output from inverter 321a is also provided as a signal N2 to NAND gate 307a through inverters 321b, 321c and 321d. Row address signal RA1 is input to 3 NAND gate 305. An output from 3 NAND gate 305 is input to boosting circuit 301 through inverter 309a.

Especially, the output from inverter 309a is input to inverter 317a of boosting circuit 301 and the control electrode of PMOS 315. PMOS 315 has one of its source/drain connected to the power supply potential Vcc. The other one of the source/drain of PMOS 315 is connected to one of the electrodes of capacitor 319, as well as to one of the source/drain of PMOS 311. An output from inverter 317a is applied through inverter 317b to the other electrode of the capacitor 319.

An output from NAND gate 307a is input to NAND gate 307b. Row address signal RA2 is input to NAND gate 307b. An output from NAND gate 307b is applied to control electrodes of PMOS 311 and NMOS 313 through inverter 309b. NMOS 313 has one of its source/drain connected to the ground potential. The other one of the source/drain of each of PMOS 311 and NMOS 313 are connected to each other, and control signal $\phi_1$ is output therefrom.

Figure 2:
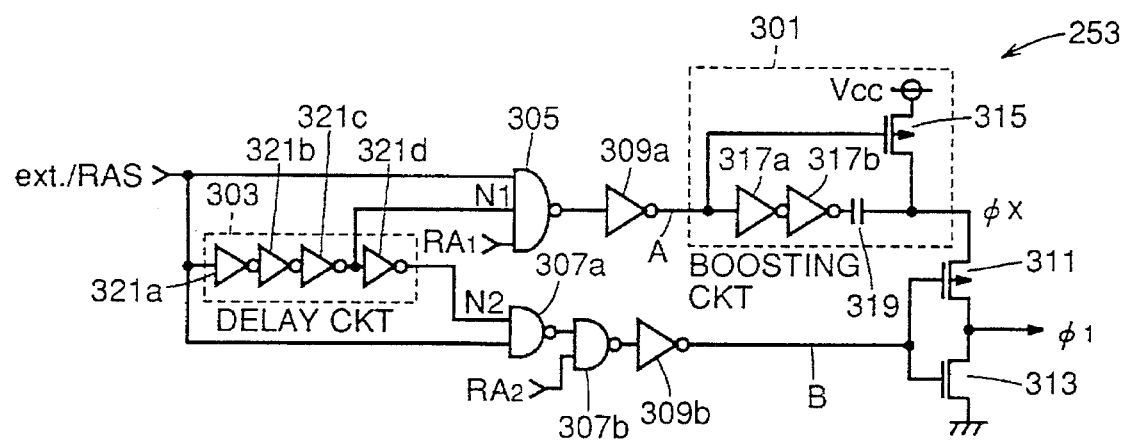
FIG. 2 is a schematic diagram of a switching signal generating circuit shown in FIG. 1.
Figure 3:
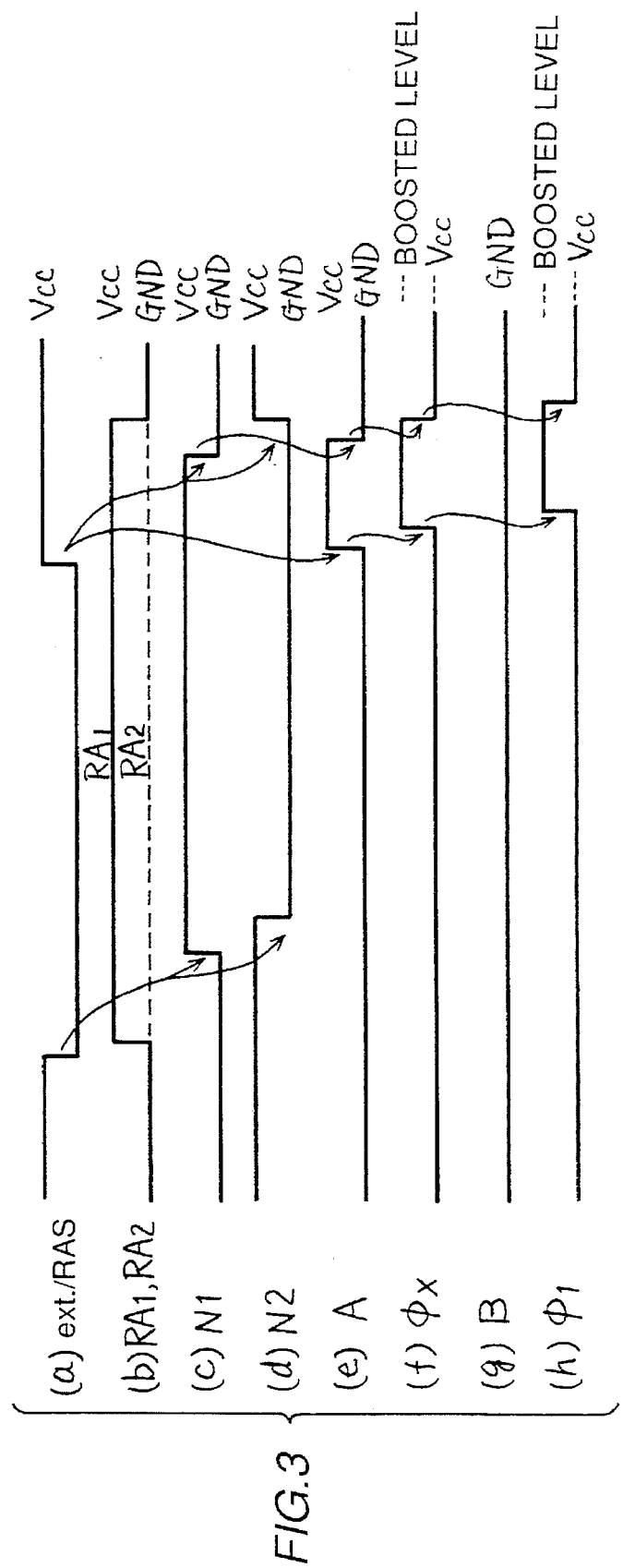
FIG. 3 is a time chart showing the operation of the switching signal generating circuit shown in FIG. 2, when a word line WL1 is selected.

FIG. 3 is a time chart of the signals required in the switch signal generating circuit of FIG. 2, when word line WL1 is selected, in which (a) shows waveform of external /RAS, (b) shows waveforms of row address signals RA1, RA2, (c) shows waveform of signal N1, (d) shows waveform of signal N2, (e) shows the state at node (a), (f) shows waveform of signal $\phi_X$, (g) shows the state at node B, and (h) shows waveform of control signal $\phi_1$.

Operation when word line WL1 is selected, that is, when memory M1 is selected, will be described with reference to FIGS. 3 and 2.

First, external /RAS changes from the H level to the L level. Because of this change in the signal level, row address signal RA1 changes from the L level to the H level, while row address signal RA2 remains at the L level. Signals N1 and N2 are delayed signals of the inverse phase and synchronous with external /RAS, obtained through delay circuit 303. Therefore, receiving external /RAS and the signal N1 output from delay circuit 303, 3 NAND gate 305 outputs a signal at the H level, and node A is at the L level, since there is inverter 309a. Accordingly, PMOS 315 turns on and signal $\phi_X$ is at the power supply potential Vcc.

Meanwhile, the output from NAND gate 307a is at the H level, because of the external /RAS and the signal N2 output from delay circuit 303. NAND gate 307b outputs a signal at the H level, as it receives the output from NAND gate 307a and row address signal RA2. The signal is inverted by inverter 309b, and node B attains to the L level.

PMOS 311 receiving the L level signal at the node B turns on, and NMOS 313 receiving the signal at the L level of node B turns off. Therefore, the power supply potential level Vcc, which is the potential level of signal $\phi_X$ is output as control signal $\phi_1$, through PMOS 311.

Then, after the external /RAS is kept at the L level for a prescribed time period, external /RAS rises to the H level. Therefore, the output from 3 NAND gate 305 attains to and kept at the L level only during the time period in which external /RAS, signal N1 and row address RA1 are all at the H level. The output from inverter 309a is kept at the H level only for that time period, and node A attains to the H level. Therefore, PMOS 315 turns off, and the electrode of capacitor 319 which is connected to inverter 317b attains to the H level. Accordingly, signal $\phi_X$ is boosted to a boosted potential level higher than the power supply potential Vcc only for that time period. The boosted signal $\phi_X$ is output as the boosted control signal $\phi_1$ through PMOS 311.

Thereafter, as the signal N1, which is an output from delay circuit 303, attains to the L level, node A returns from the H level to the L level. Accordingly, signal $\phi_X$ returns from the boosted potential level to the power supply potential level.

Namely, after the rise of external /RAS, control signal $\phi_1$ is boosted and kept at the boosted potential level which is higher than the power supply potential level for a prescribed time period. Therefore, connection transistors Q1 and Q2 of the sense amplifier shown in FIG. 1 are surely turned on, and data from sense amplifier 7 is fully transmitted to memory cell MC1. Thus, restore operation is ensured.

Figure 4:
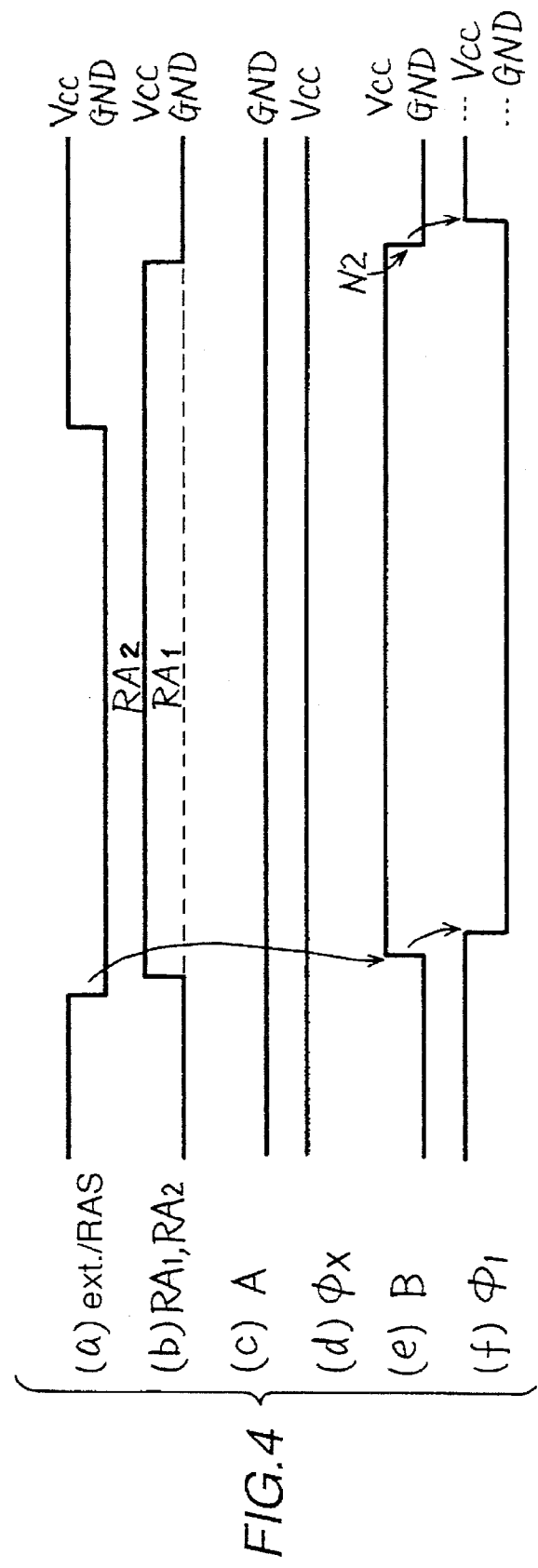
FIG. 4 is a time chart showing the operation of the switching signal generating circuit of FIG. 2, when a word line WL2 is selected.

FIG. 4 is a time chart of the signals required in the switching circuit when word line WL2 is selected, in which (a) shows waveform of external /RAS, (b) shows waveform of row address signals RA1 and RA2, (c) shows the state at node A, (d) shows waveform of signal $\phi_X$, (e) shows the state at node B, and (f) shows the waveform of control signal $\phi_1$.

The operation when word line WL2 is selected, that is, when memory cell MC2 is selected, will be described with reference to FIGS. 4 and 2.

First, external /RAS changes from the H level to the L level. Row address signal RA2 changes from the L level to the H level, and row address signal RA1 is kept at the L level. NAND gate 307a, which receives external /RAS, outputs a signal at the H level, and NAND gate 307b, which receives this signal and row address signal RA2, provides an output at the L level. Therefore, the output from inverter 309b attains to the H level, and node B also attains to the H level. Accordingly, PMOS 311 turns off, and NMOS 313 turns on. Control signal $\phi_1$ attains to the L level, because of the ground potential connected to NMOS 313.

Namely, when memory cell MC2 is selected, memory cell MC1 is separated from sense amplifier 7.

In this manner, control signal $\phi_1$ or $\phi_2$ is boosted only for a prescribed period after the rise of external /RAS, and complementary control signal $\phi_2$ or $\phi_1$ attains to the L level.

Though a circuit generating control signal $\phi_1$ is shown in FIG. 2, in the circuit for generating control signal $\phi_2$, row address RA1 is replaced by row address RA2.

After one bit line pair is connected to the sense amplifier in the above described manner, word line WL1 or WL2 rises, and small potential in memory cell MC1 or MC2 is read to bit line BL1 or BL2. Bit line BL1 or BL2 is at an intermediate potential between the power supply potential level and the ground potential level at the initial state, and it obtains small amplitude by the charges from memory cell MC1 or MC2. Therefore, even when control signal $\phi_1$ or $\phi_2$ input to the control electrode of connection transistor Q1 or Q3 has not been boosted, potential change in bit line BL1 or BL2 can be sufficiently transmitted to sense amplifier 7.

Meanwhile, at the time of restore operation, control signal $\phi_1$ or $\phi_2$ is boosted only for a prescribed time period necessary for restoring, that is, only for the delay time of delay circuit 303. Therefore, the signal amplified by sense amplifier 7 can be fully written to memory cell MC1 or MC2. Accordingly, the charge pump circuit 107 which was required in the conventional switch signal generating circuit 19 becomes unnecessary. As the charge pump circuit 107 operates continuously, power consumption can be reduced by the elimination of this circuit.

FIG. 5 is a schematic block diagram of a DRAM as a semiconductor memory device in accordance with another embodiment of the present invention.

Figure 6:
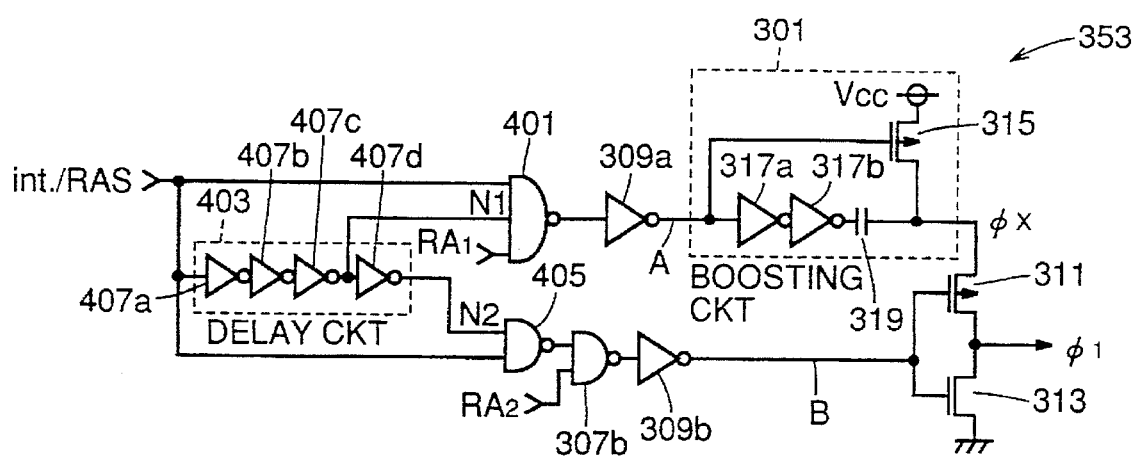
FIG. 6 is a schematic diagram of the switching signal generating circuit shown in FIG. 5.
Figure 14:
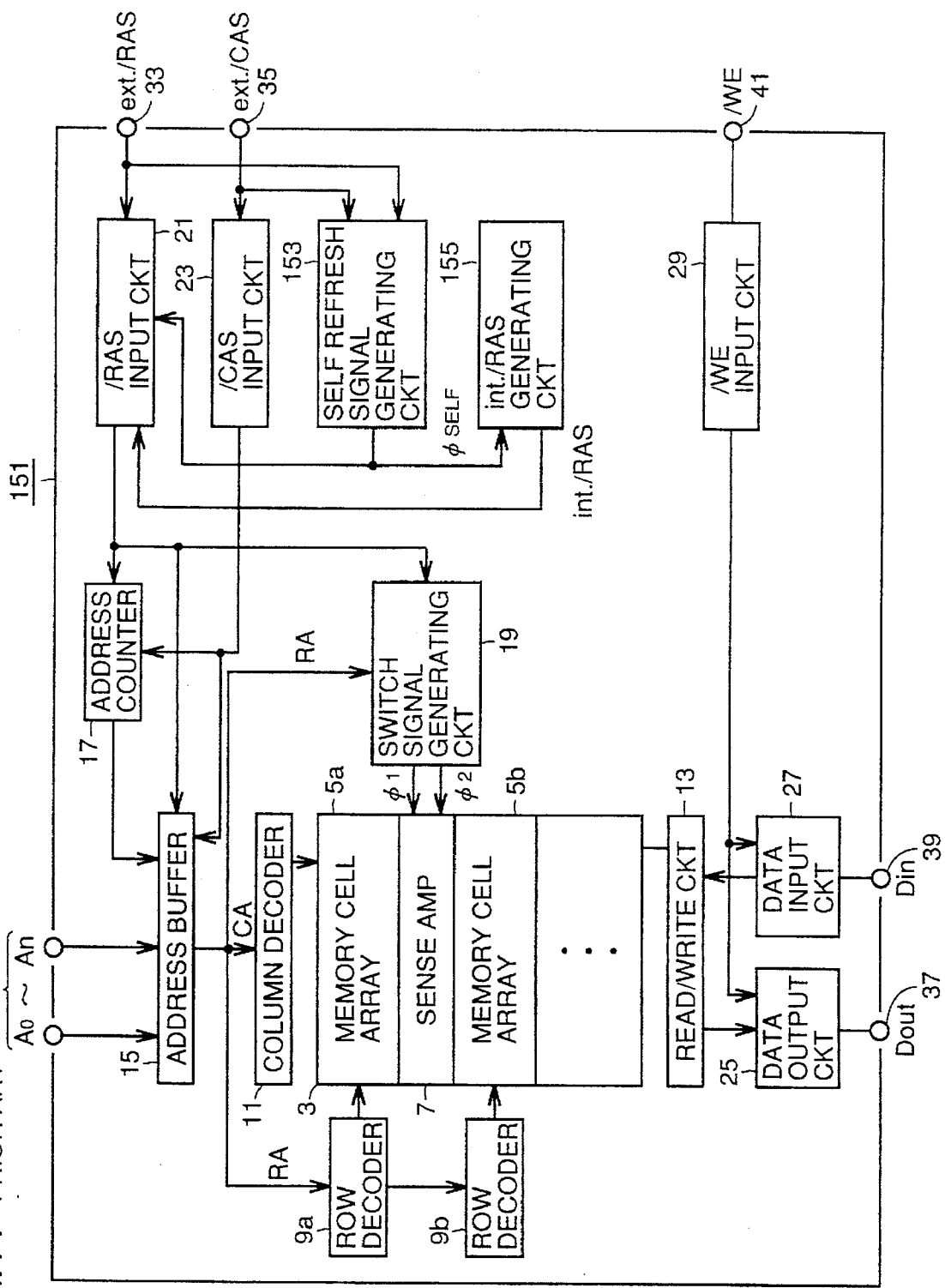
FIG. 14 is a schematic block diagram of another DRAM as another conventional semiconductor memory device.
Figure 15:
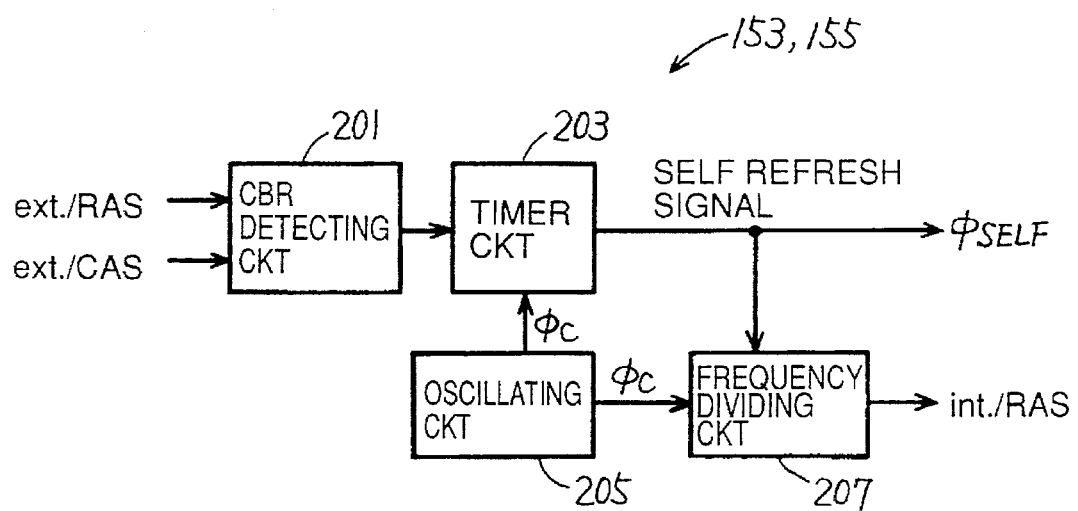
FIG. 15 is a block diagram showing internal structure of the self refresh signal generating circuit and the internal /RAS generating circuit shown in FIG. 14.
Figure 16:
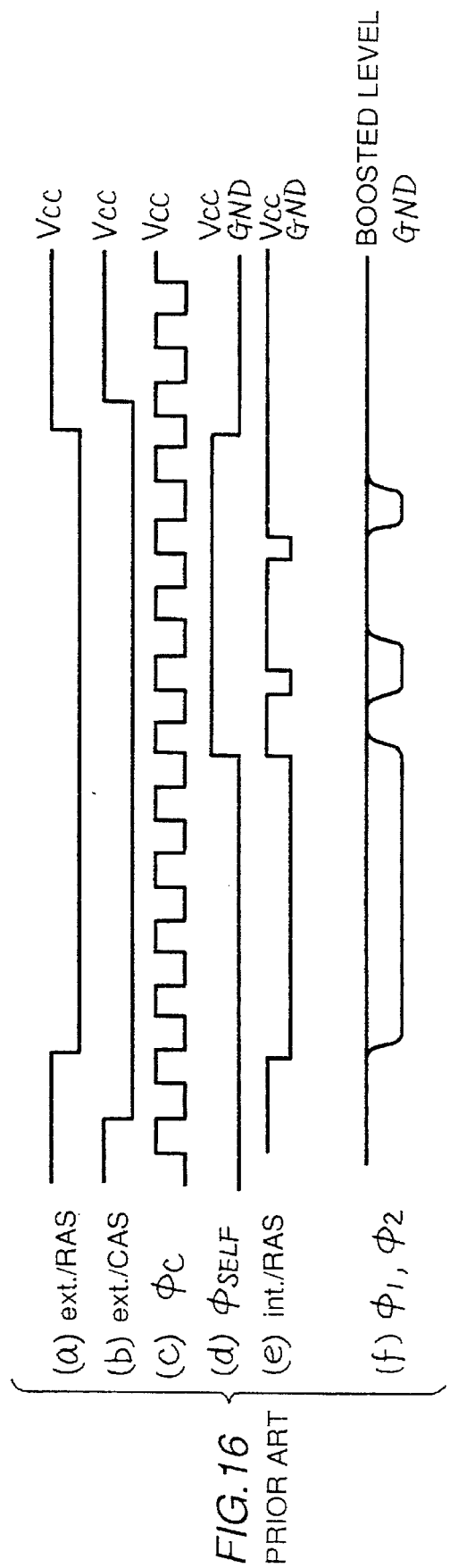
FIG. 16 is a time chart showing the operation of the self-refresh signal generating circuit and the internal RAS generating circuit shown in FIG. 15.

Portions different from the conventional example shown in FIG. 14 will be mainly described. More specifically, in place of switch signal generating circuit 19 shown in FIG. 14, the DRAM 351 of this embodiment includes a switch signal generating circuit 353. Switch signal generating circuit 353 is as shown in FIG. 6. Switch signal generating circuit 353 shown in FIG. 6 is similar to switch signal generating circuit 253 shown in FIG. 2 except the following points. Namely, the DRAM 351 shown in FIG. 5 has a self refresh signal generating circuit 153 and an internal /RAS generating circuit 155 for self refresh function, and switch signal generating circuit 253 operates in response to internal /RAS, not the external /RAS, at the time of self refreshing.

More specifically, switch signal generating circuit 353 includes, in place of 3 NAND gate 305 receiving external /RAS, delay circuit 303 and NAND gate 307a of FIG. 2, a 3 NAND gate 401, a delay circuit 403 and an NAND gate 405. To the 3 NAND gate 401, delay circuit 403 and NAND gate 405, internal (IND) /RAS is input.

Figure 7:
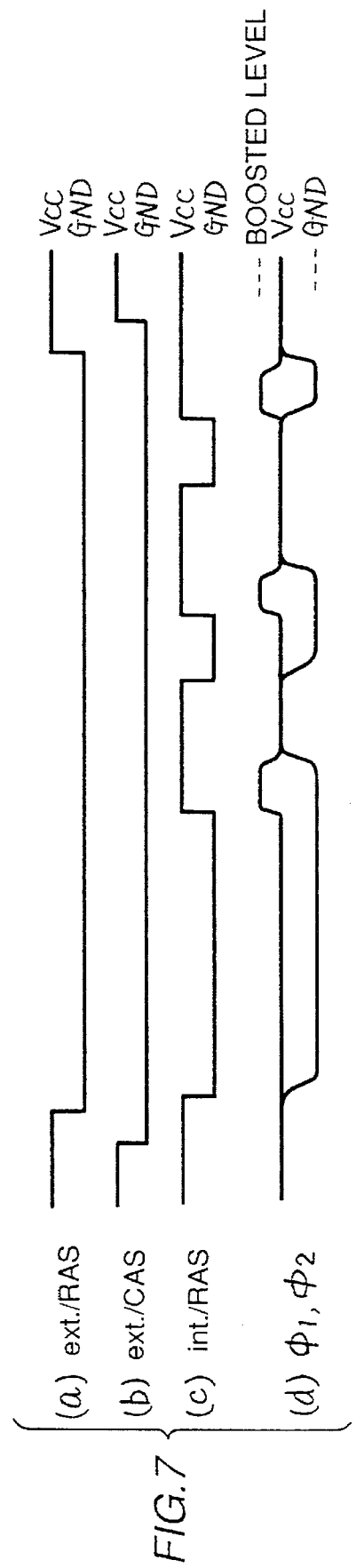
FIG. 7 is a time chart showing the operation of the switching signal generating circuit of FIG. 6.

FIG. 7 is a time chart of signals generated in the switch signal generating circuit shown in FIG. 6 in which (a) shows the waveform of external /RAS, (b) shows the waveform of external /CAS, (c) shows the waveform of internal /RAS, and (d) shows waveforms of control signals $\phi_1$ and $\phi_2$.

Referring to FIG. 7, the operation will be briefly described. As already mentioned, at the time of self refresh operation, external /CAS changes from the H level to the L level, before the change of the external /RAS from the H level to the L level. Then, after the external RAS and external /CAS are kept at the L level for a prescribed time period, self refresh signal $\phi_{SELF}$ is generated from self refresh signal generating circuit 153, and in response, internal /RAS changes from the L level to the H level. Consequently, potential level of control signal $\phi_1$ or $\phi_2$ is raised to the boosted potential level, which is higher than the power supply potential Vcc. Therefore, as in the embodiment described with reference to FIGS. 1 to 4, it is not necessary to set control signal $\phi_1$ or $\phi_2$ constantly at the boosted potential level. Therefore, power consumption at the self refresh can be reduced by that amount. Therefore, life of a portable equipment which is affected by the power consumption in self refresh operation can be improved.

Figure 8:
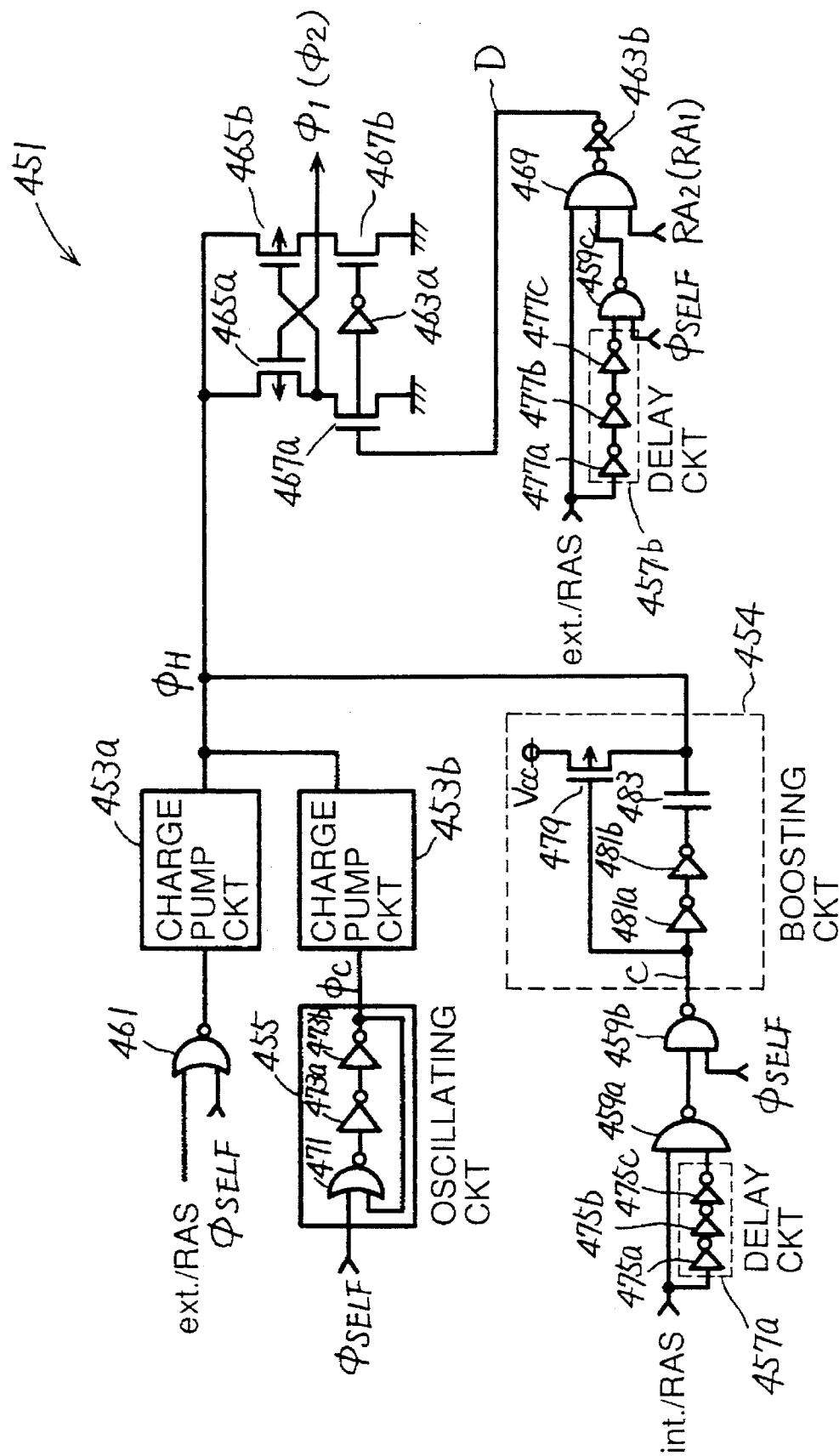
FIG. 8 shows a switching signal generating circuit of a DRAM as a semiconductor memory device in accordance with a further embodiment of the present invention.

FIG. 8 shows a switch signal generating circuit of the DRAM as a semiconductor memory device in accordance with a further embodiment of the present invention.

In DRAM 351 shown in FIG. 5, in normal operation, a control signal $\phi_1$ or $\phi_2$ boosted for a prescribed time period after the rise of external /RAS is applied to sense amplifier 7, and in self refresh operation, control signal $\phi_1$ or $\phi_2$ which is boosted for a prescribed time period after the rise of internal /RAS is applied to the sense amplifier 7. In such a method, when restore operation is started during normal operation, a prescribed period of time for boosting is necessary after the rise of external /RAS, which hinders higher cycle time. Therefore, in the embodiment shown in FIG. 8, a switch signal generating circuit is shown which can generate control signal $\phi_1$ or $\phi_2$ which is constantly boosted at the boosted potential level in normal operation and which can generate control signal $\phi_1$ or $\phi_2$ which is boosted only for a prescribed time period, in the self refresh operation.

Referring to FIG. 8, switch signal generating circuit 451 includes charge pump circuits 453a, 453b, a boosting circuit 454, an oscillating circuit 455, delay circuits 457a and 457b, NAND gates 459a, 459b, 459c, an NOR gate 461, inverters 463a and 463b, PMOSs 465a, 465b, NMOSs 467a, 467b and a 3 NAND gate 469.

Oscillating circuit 455 includes an NOR gate 471, and inverters 473a and 473b. Delay circuit 457a includes inverters 457a, 457b and 457c. Delay circuit 457b includes inverters 477a, 477b and 477c. Boosting circuit 454 includes inverters 481a, 481b, a capacitor 483 and a PMOS 479.

Connection will be described. External /RAS and self refresh signal $\phi_{SELF}$ are input to NOR gate 461. An output from NOR gate 461 is input to charge pump circuit 453a. Self refresh signal $\phi_{SELF}$ is input to the NOR gate 471 of oscillating circuit 455, and an output from inverter 473b is also applied to NOR gate 471. An output from NOR gate 471 is input through inverters 473a and 473b to charge pump circuit 453b as a signal $\phi_C$. Charge pump circuits 453a and 453b boost signals, and provides a boosting signal $\phi_H$.

Meanwhile, internal (INT) /RAS is input to NAND gate 459a as well as to inverter 475a of delay circuit 457a. An output from inverter 475a is input through inverters 475b and 475c to NAND gate 459a. An output from NAND gate 459a is input to NAND gate 459b. Self refresh signal is also input to NAND gate 459b. An output from NAND gate 459b is input to inverter 481a of boosting circuit 454, and to the control electrode of PMOS 479. One of the source/drain of PMOS 479 is connected to power supply potential Vcc, and the other one is connected to one electrode of capacitor 483. To the other electrode of capacitor 483, an output from inverter 481a is applied through inverter 481b. From one electrode of capacitor 483, boosting signal $\phi_H$ is output.

The boosting signal $\phi_H$ is applied to one of the source/drain of each of PMOSs 465a and 465b. The other one of the source/drain of PMOSs 465a and 465b is connected to one of the source/drain of NMOSs 467a and 467b. The other one of the source/drain of each of NMOSs 467a and 467b is connected to the ground potential. One of the source/drain of NMOS 467a is connected to the control electrode of PMOS 465b, and one of the source/drain of NMOS 467b is connected to the control electrode of PMOS 465a.

External /RAS is applied to 3 NAND gate 469, and further to the inverter 477a of delay circuit 457b. An output from inverter 477a is applied through inverters 477b and 477c to NAND gate 459c. Self refresh signal $\phi_{SELF}$ is also applied to NAND gate 459c. An output from NAND gate 459c is applied to 3 NAND gate 469. To the other input of 3 NAND gate 469, row address signal RA2 (RA1) is applied. An output from 3 NAND gate 469 is applied to control electrode of NMOS 467a through inverter 463b, and to the control electrode of NMOS 467b through inverter 463a. Thus control signal $\phi_1$ ($\phi_2$) is provided.

Figure 9:
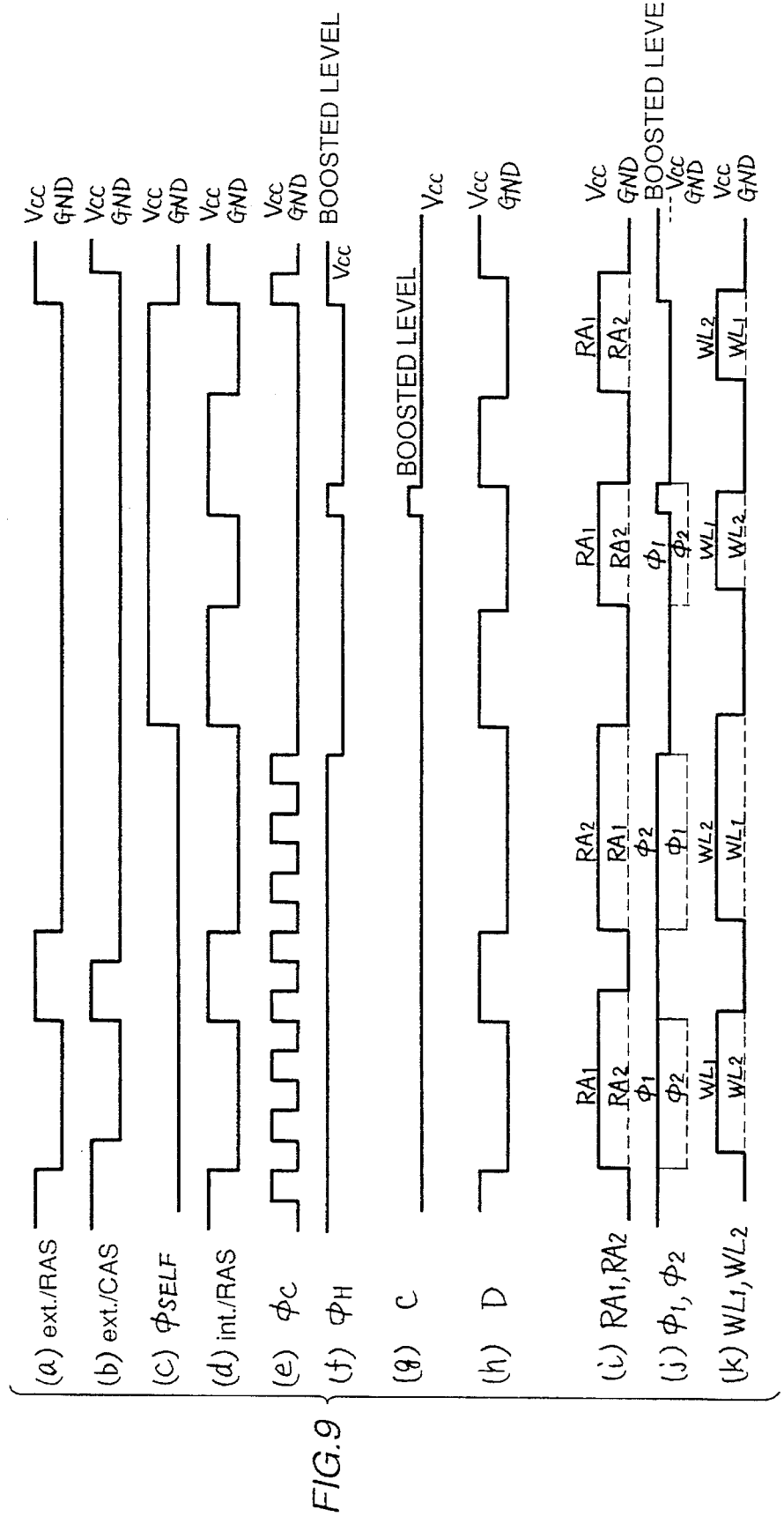
FIG. 9 is a time chart showing the operation of the switching signal generating circuit shown in FIG. 8.

FIG. 9 is a time chart of signals shown in the switch signal generating circuit shown in FIG. 8, in which (a) shows the waveform of external /RAS, (b) shows the waveform of external /CAS, (c) shows the waveform of self refresh signal $\phi_{SELF}$, (d) shows the waveform of internal /RAS, (e) shows the waveform of signal $\phi_C$, (f) shows the waveform of boosting signal $\phi_H$, (g) shows the waveform at node C, (h) shows the waveform at node D, (i) shows waveforms of row addresses RA1 and 2, (j) shows waveform of control signal $\phi_1$ or $\phi_2$, and (k) shows states of word lines WL1 and WL2.

The operation will be described with reference to FIG. 9. In normal operation, self refresh signal $\phi_{SELF}$ is at the L level. Therefore, NOR gate 461 provides a signal at the H level or the L level, dependent on the signal level of external /RAS. By contrast, oscillating circuit 455 outputs a signal $\phi_C$ which is at the H level. In this state, charge pump circuits 453a and 453b operate in the similar manner as the conventional charge pump circuits 103 and 107 shown in FIG. 12.

Meanwhile, since a self refresh signal $\phi_{SELF}$ at the L level is input to NAND gate 459b, output therefrom attains to the H level. An H level signal is input to the boosting circuit 454. Therefore, node C is kept at the H level of the power supply potential Vcc. Therefore, boosting circuit 454 does not operate.

The self refresh signal $\phi_{SELF}$ at the L level is also input to NAND gate 459c, and the output therefrom is at the H level. Therefore, the output of 3 NAND gate 469 is determined by the levels of external /RAS and of row address RA2 (RA1). Namely, in this state, the relation between inverter 101b and NAND gate 113 is equivalent to the relation between 3 NAND gate 469 and inverter 463b.

Figure 12:
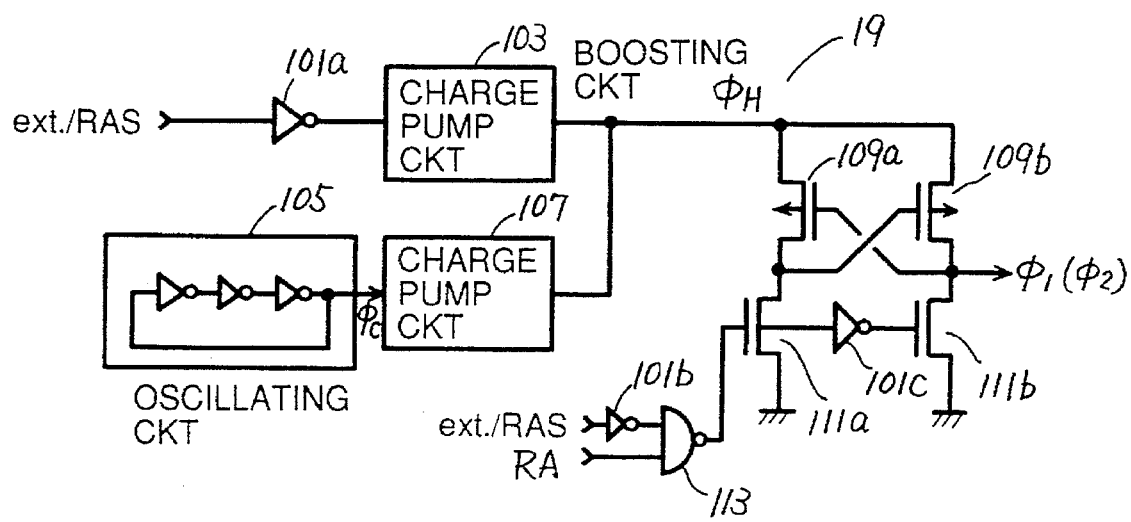
FIG. 12 is a schematic diagram of the switching signal generating circuit of FIG. 10.
Figure 13:
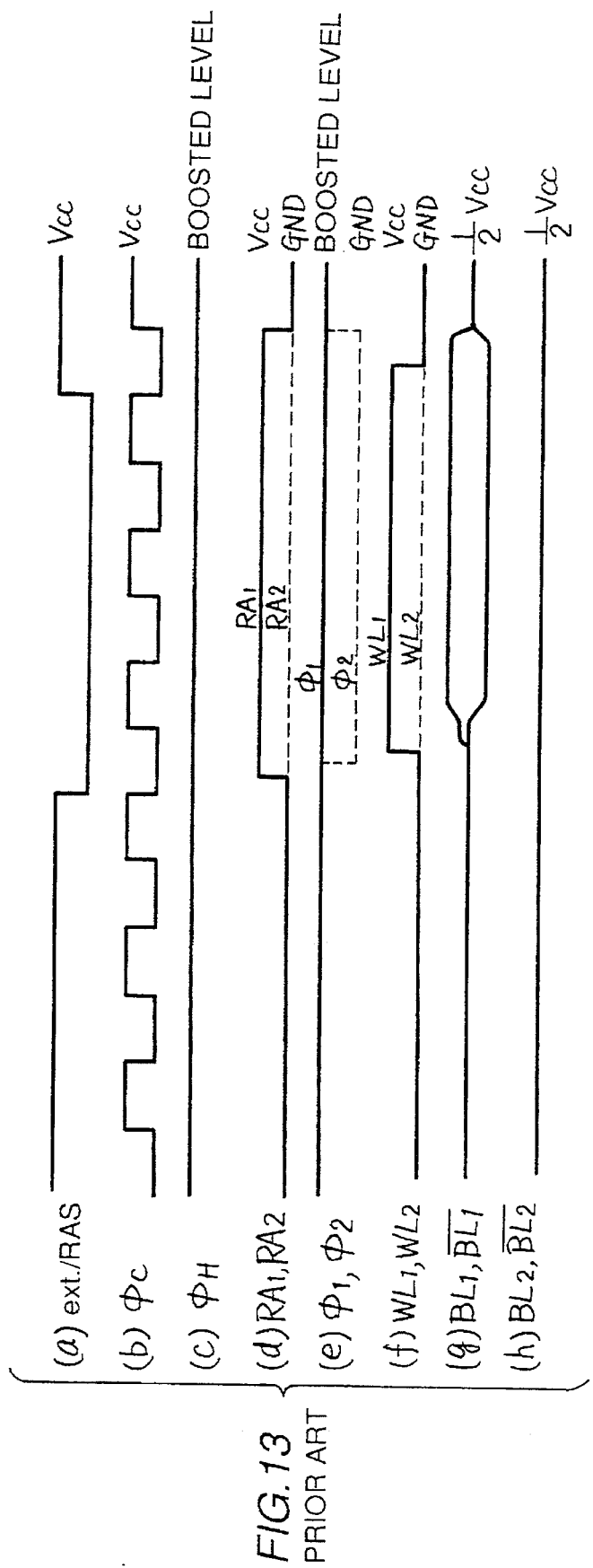
FIG. 13 is a time chart showing operation of the switching signal generating circuit shown in FIG. 12.
Figure 13:
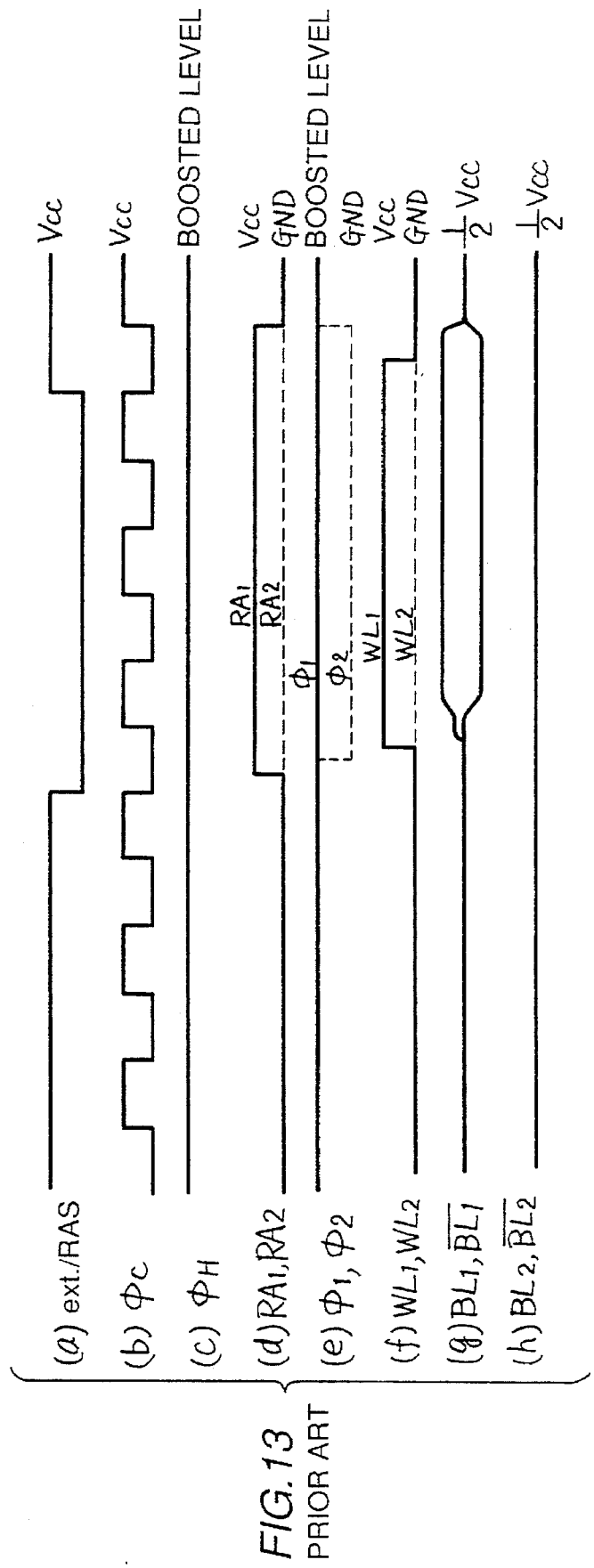

In this manner, in normal operation, the circuit operates similarly to the prior art example shown in FIG. 12, and therefore the boosting signal $\phi_H$ is constantly kept at the boosted level. Therefore, the control signal $\phi_1$ ($\phi_2$) at the boosted level is constantly output.

However, when self refresh operation starts, the switch signal generating circuit 451 operates in the similar manner as the embodiment shown in FIG. 6. More specifically, in self refresh operation, self refresh signal $\phi_{SELF}$ attains to the H level. Therefore, the output from NOR gate 461 attains to the L level, output from NOR gate 471 of oscillating circuit 455 also attains to L level, and the signal $\phi_C$, which is the output from oscillating circuit 455, also attains to the L level. Therefore, charge pump circuits 453a and 453b stop their operations. Therefore, boosting signal $\phi_H$ attains to the level of the power supply potential Vcc. Then, internal /RAS changes from the H level to the L level. Accordingly, NAND gate 459a provides a signal at the H level. The period in which the output from NAND gate 459a is kept at the H level corresponds to the delay time by the delay circuit 457a. NAND gate 459b provides an L level signal for the period in which inputs are both at the H level, that is, the period corresponding to the delay time of delay circuit 457a.

Therefore, PMOS 479 turns on, and boosted signal $\phi_H$ is kept at the power supply potential Vcc.

Thereafter, NAND gate 459a continues to output the L level signal for a prescribed time period after the rise of internal /RAS. Therefore, NAND gate 459b also provides the H signal for that period, charging the capacitor 483. Thus a boosting signal $\phi_H$ is generated from capacitor 483 only for a prescribed time period. Thus control signal $\phi_1$ is also output, kept boosted only for that time period.

In this manner, other than in the self refresh operation, boosting signal $\phi_H$ is constantly generated as in the prior art example, and in self refresh operation, the boosting signal $\phi_H$ is generated only for a time period necessary. Therefore, in normal operation, restore operation is completed within the cycle in which external /RAS is at the L level, while in the self refresh operation, restore operation takes place after the rise of internal /RAS signal. Therefore, the cycle time in the normal reading operation can be improved while power consumption in self refresh operation can be reduced.

In self refresh operation, it is preferred that the refresh period is set as long as possible in order to reduce power consumption. Therefore, it is not a problem if restore operation takes place after the rise of internal /RAS signal.

In summary, according to the embodiments of the present invention, a first or a second control signal at a boosted potential level higher than the power supply potential level is applied only for a prescribed time period, to a control electrode of a first connection transistor for connecting a first bit line pair to a sense amplifier, or to a control electrode of a second connection transistor for connecting a second bit line pair to the sense amplifier. Therefore, as compared with the operation in which the first or the second control signal which is continuously set at the boosted potential level is generated, power consumption can be reduced.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device, comprising:

a first bit line pair to one of which bit lines a memory cell is connected;

a second bit line pair to one of which bit lines a memory cell is connected;

a sense amplifier for amplifying potential of said first bit line pair or said second bit line pair;

control signal generating means, responsive to an active state of a control signal, for generating a first control signal or a second control signal which is at a potential level, higher than a power supply potential level, for a prescribed time period after the control signal changes from the active state to an inactive state;

a first connection transistor for connecting said first bit line pair to said sense amplifier in response to application of the first control signal generated by said control signal generating means to its control electrode; and a second connection transistor for connecting said second bit line pair and said sense amplifier in response to application of the second control signal generated by said control signal generating means to its control electrode.

2. A semiconductor memory device, comprising:

a first bit line pair to one of which bit lines a memory cell is connected;

a second bit line pair to one of which bit lines a memory cell is connected;

a sense amplifier for amplifying potential of said first bit line pair or said second bit line pair; control signal generating means for generating a first control signal or a second control signal which is at a boosted potential level for a prescribed time period higher than a power supply potential level;

a first connection transistor for connecting said first bit line pair to said sense amplifier in response to application of the first control signal generated by said control signal generating means to its control electrode; and a second connection transistor for connecting said second bit line pair and said sense amplifier in response to application of the second control signal generated by said control signal generating means to its control electrode, wherein said control signal generating means includes delay means receiving a prescribed signal for delaing the received signal for a prescribed time period; and boosting means for generating a boosting signal based on said received signal for generating the first control signal or the second control signal of the boosted potential level, corresponding to the prescribed time period by which the prescribed signal is delayed by said delay means.

3. A semiconductor memory device, comprising:

a first bit line pair to one of which bit lines a memory cell is connected;

a second bit line pair to one of which bit lines a memory cell is connected;

a sense amplifier for amplifying potential of said first bit line pair or said second bit line pair;

control signal generating means for generating a first control signal or a second control signal which is at a boosted potential level for a prescribed time period higher than a power supply potential level;

a first connection transistor for connecting said first bit line pair to said sense amplifier in response to application of the a first control signal generated by said control signal generating means to its control electrode; and a second connection transistor for connecting said second bit line pair and said sense amplifier in response to application of the second control signal generated by said control signal generating means to its control electrode, wherein said control signal generating means includes a switching signal generating circuit for generating said first control signal for turning on or off said first connection transistor or for generating said second control signal for turning on or off said second connection transistor.

4. A semiconductor memory device comprising:

a first bit line pair to one of which bit lines a memory cell is connected;

a second bit line pair to one of which bit lines a memory cell is connected;

a sense amplifier for amplifying potential of said first bit line pair or said second bit line pair;

control signal generating means for generating a first control signal or a second control signal which is at a boosted potential level for a prescribed time period higher than a power supply potential level;

a first connection transistor for connecting said first bit line pair to said sense amplifier in response to application of the first control signal generated by said control signal generating means to its control electrode;

a second connection transistor for connecting said second bit line pair and said sense amplifier in response to application of the second control signal generated by said control signal generating means to its control electrode; and input means receiving an external control signal wherein said control signal generating means generates, in normal operation, the first control signal to be applied to said first connection transistor or the second control signal to be applied to said second connection transistor of the boosted potential level only for the prescribed time period, in response to trailing edge of level change of the external control signal input through said input means.

5. The semiconductor memory device according to claim 4, wherein said input means includes a /RAS input circuit receiving the external /RAS signal.

6. A semiconductor memory device comprising:

a first bit line pair to one of which bit lines a memory cell is connected;

a second bit line pair to one of which bit lines a memory cell is connected;

a sense amplifier for amplifying potential of said first bit line pair or said second bit line pair;

control signal generating means for generating a first control signal or a second control signal which is at a boosted potential level for a prescribed time period higher than a power supply potential level;

a first connection transistor for connecting said first bit line pair to said sense amplifier in response to application of the first control signal generated by said control signal generating means to its control electrode;

a second connection transistor for connecting said second bit line pair and said sense amplifier in response to application of the second control signal generated by said control signal generating means to its control electrode;

input means receiving an external control signal;

self refresh signal generating means for generating a self refresh signal for self refreshing data of a memory cell connected to one of the bit lines of said first bit line pair or the memory cell connected to one of the bit lines of said second bit line pair, based on the external control signal input through said input means; and internal control signal generating means for generating an internal control signal based on the self refresh signal generated from said self refresh signal generating means; wherein said control signal generating means generates, in self refresh operation, the first control signal to be applied to said first connection transistor or the second control signal to be applied to said second connection transistor of boosted potential level only for the prescribed period, in response to trailing edge of level change of the internal control signal generated by said internal control signal generating means.

7. The semiconductor memory device according to claim 6, wherein said input means includes a /RAS input circuit receiving an external /RAS signal.

8. A semiconductor memory device, comprising:

a first bit line pair to one of which bit lines a memory cell is connected;

a second bit line pair to one of which bit lines a memory cell is connected;

a sense amplifier for amplifying potential of said first bit line pair or said second bit line pair;

control signal generating means for generating a first control signal or a second control signal;

a first connection transistor for connecting said first bit line pair to said sense amplifier in response to application of the first control signal generated by said control signal generating means to its control electrode;

a second connection transistor for connecting said second bit line pair to said sense amplifier in response to application of the second control signal generated by said control signal generating means to its control electrode;

input means receiving an external control signal;

self refresh signal generating means for generating a self refresh signal for self refresh of data in the memory cell connected to one of the bit lines of said first bit line pair or of the memory cell connected to one of the bit lines of said second bit line pair based on the external control signal input through said input means; and internal control signal generating means for generating an internal control signal based on the self refresh signal generated by said self refresh signal generating means; wherein said control signal generating means includes first generating means for generating, in normal operation, a third control signal which is at a boosted power potential level, higher than power supply potential level, as the first control signal to be applied to said first connection transistor or a fourth control signal which is at the boosted potential level as the second control signal to be applied to said second connection transistor, and second generating means for generating, in self refresh operation, a fifth control signal which is at the boosted potential level only for a prescribed time period as the first control signal to be applied to said first connection transistor or a sixth control signal which is at the boosted potential level only for a prescribed time period as the second control signal to be applied to said second connection transistor, in response to trailing edge of level change in the internal control signal generated by said internal control signal generating means.

9. The semiconductor memory device according to claim 8, wherein said control signal generating means includes delay means receiving a prescribed signal for providing a delay of a prescribed time period to said signal, and boosting means for generating a boosting signal based on said signal for generating the first control signal or the second control signal of the boosted potential level, corresponding to the prescribed time period of delay provided by said delay means to said signal.

10. The semiconductor memory device according to claim 8, wherein said control signal generating means includes a switching signal generating circuit for generating said first control signal for turning on or off said first connection transistor or for generating said second control signal for turning on or off said second connection transistor.

11. The semiconductor memory device according to claim 8, wherein said input means includes a /RAS input circuit receiving an external /RAS signal, and said internal control signal generating means includes an internal /RAS signal generating circuit for generating an internal /RAS signal based on the self refresh signal generated by said self refresh signal generating means.

* * * * *